(12) United States Patent
Zhou et al.

(10) Patent No.: US 10,490,294 B2
(45) Date of Patent: Nov. 26, 2019

(54) DYNAMIC FUSE SENSING AND LATCH CIRCUIT

(71) Applicant: SKYWORKS SOLUTIONS, INC., Woburn, MA (US)

(72) Inventors: Bo Zhou, Acton, MA (US); Guillaume Alexandre Blin, Carlisle, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 16/452,747

(22) Filed: Jun. 26, 2019

(65) Prior Publication Data

US 2019/0318793 A1 Oct. 17, 2019

Related U.S. Application Data

(63) Continuation of application No. 15/984,666, filed on May 21, 2018, now Pat. No. 10,347,350.

(60) Provisional application No. 62/508,449, filed on May 19, 2017.

(51) Int. Cl.
*G11C 17/18* (2006.01)
*G11C 17/16* (2006.01)

(52) U.S. Cl.
CPC ............ *G11C 17/18* (2013.01); *G11C 17/165* (2013.01)

(58) Field of Classification Search
CPC ................................ G11C 17/165; G11C 17/18
See application file for complete search history.

(56) References Cited

U.S. PATENT DOCUMENTS

| | | | |
|---|---|---|---|
| 6,108,261 A | 8/2000 | Kim et al. | |
| 6,331,962 B1 | 12/2001 | Kobayashi et al. | |
| 6,515,934 B2 | 2/2003 | Kobayashi et al. | |
| 7,304,527 B1 | 12/2007 | Guzman et al. | |
| 7,986,024 B2 | 7/2011 | Nirschl | |
| 8,441,266 B1 | 5/2013 | Xiao et al. | |
| 2002/0015328 A1* | 2/2002 | Dono | G11C 14/00 365/185.08 |
| 2002/0196693 A1 | 12/2002 | Bertin et al. | |
| 2004/0129952 A1* | 7/2004 | Griesmer | G11C 8/20 257/202 |
| 2005/0036259 A1* | 2/2005 | Hokenmaier | G06F 1/3203 361/104 |
| 2008/0211513 A1 | 9/2008 | Lysinger et al. | |

(Continued)

*Primary Examiner* — Tuan T Nguyen
(74) *Attorney, Agent, or Firm* — Lando & Anastasi, LLP

(57) ABSTRACT

Systems and methods are directed to an integrated circuit to sense a state of a fuse having one of a blown state and an unblown state. The integrated circuit includes a fuse sensing circuit having an input and a plurality of outputs, the input being configured to receive a sense signal having a first state and a second state, and the plurality of outputs including a first output to connect to a first contact of the fuse, a second output to provide a first signal indicative of the state of the fuse, and a third output to provide a second signal indicative of the state of the fuse, the fuse sensing circuit being configured to provide the first and second signals responsive to a change in state of the sense signal, and a latch circuit having a first input to receive the first signal, a second input to receive the second signal, and an output to provide an output signal indicative of the state of the fuse, the latch circuit being configured to store and maintain a value of the output signal.

20 Claims, 5 Drawing Sheets

(56) References Cited

U.S. PATENT DOCUMENTS

2010/0238741 A1* 9/2010 Miyatake .............. G11C 17/18
365/189.05
2012/0038410 A1* 2/2012 Liao .................... G11C 29/026
327/434

* cited by examiner

US 10,490,294 B2

DYNAMIC FUSE SENSING AND LATCH CIRCUIT

CROSS-REFERENCE TO RELATED APPLICATIONS

This application claims priority under 35 U.S.C. § 120 as a continuation of U.S. patent application Ser. No. 15/984,666, titled "DYNAMIC FUSE SENSING AND LATCH CIRCUIT," filed on May 21, 2018, which claims priority to U.S. Provisional Application Ser. No. 62/508,449, titled "DYNAMIC FUSE SENSING AND LATCH CIRCUIT," filed on May 19, 2017, each of which is incorporated herein by reference in its entirety.

BACKGROUND

Programmable fuses provide a mechanism for storing data in integrated circuits. A selected fuse can be programmed by providing the selected fuse with a relatively high current to "blow" the selected fuse, permanently altering the fuse's resistance by modifying the physical structure of the fuse. To read the state of the fuse, a sense current or sense voltage is provided and a resulting voltage drop across the fuse is measured. The resulting voltage drop across the fuse can be used to form a binary representation of the fuse state (e.g., blown or unblown), as the voltage drop across the fuse is proportional to the resistance of the fuse.

SUMMARY

Aspects and examples are directed to reading a fuse state using a dynamic fuse sensing and latch circuit. The use of a dynamic fuse sensing and latch circuit provides a low-current solution to reading the state of the fuse, as the dynamic fuse sensing and latch circuit draws a non-negligible current only during the sensing operation.

According to one aspect, an integrated circuit to sense a state of a fuse having one of a blown state and an unblown state is provided, the integrated circuit including a fuse sensing circuit having an input and a plurality of outputs, the input being configured to receive a sense signal having a first state and a second state, and the plurality of outputs including a first output to connect to a first contact of the fuse, a second output to provide a first signal indicative of the state of the fuse, and a third output to provide a second signal indicative of the state of the fuse, the fuse sensing circuit being configured to provide the first and second signals responsive to a change in state of the sense signal, and a latch circuit having a first input to receive the first signal, a second input to receive the second signal, and an output to provide an output signal indicative of the state of the fuse, the latch circuit being configured to store and maintain a value of the output signal.

In one embodiment, the latch circuit is configured as a set-reset latch. In some embodiments, the plurality of outputs of the fuse sensing circuit further includes a fourth output to connect to a reference resistance. According to at least one embodiment, the reference resistance includes at least one resistor, the at least one resistor having a resistance greater than a resistance of the fuse in the unblown state and less than the resistance of the fuse in the blown state. In some embodiments, the fuse sensing circuit includes a first controlled current source and a second controlled current source. In one embodiment, a first output of the first controlled current source is coupled to the first contact of the fuse via the first output and a first output of the second controlled current source is coupled to the reference resistance.

According to some embodiments, the first controlled current source is configured to provide the first signal indicative of the state of the fuse and the second controlled current source is configured to provide the second signal indicative of the state of the fuse. In one embodiment, the first controlled current source includes a first plurality of series-connected switches and the second controlled current source includes a second plurality of series-connected switches. In some embodiments, the first plurality of series-connected switches and the second plurality of series-connected switches each includes at least one first switch that is open and non-conducting responsive to the sense signal being in the first state.

In some embodiments, the first plurality of series-connected switches and the second plurality of series-connected switches each includes at least one second switch that is open and non-conducting responsive to the sense signal being in the second state. In one embodiment, the at least one first switch of the first plurality of series-connected switches and the second plurality of series-connected switches is at least partially open and at least partially conducting during the change in state of the sense signal. In at least one embodiment, the fuse and the reference resistance are formed in the integrated circuit. In some embodiments, the plurality of outputs of the fuse sensing circuit further includes a fourth output to connect to a reference resistance, the reference resistance having a resistance greater than a resistance of the fuse in the unblown state and less than the resistance of the fuse in the blown state.

According to one aspect, an integrated circuit to sense a state of a fuse having one of a blown state and an unblown state is provided, the integrated circuit including a fuse sensing circuit including a first plurality of series-connected switches connected to the fuse, and a second plurality of series-connected switches connected to a reference resistance, the fuse sensing circuit being configured to receive a sense enable signal having a first state and a second state, to generate a first signal and a second signal indicative of the state of the fuse responsive to a transition of the sense enable signal from the first state to the second state, and to maintain the first signal and the second signal responsive to the sense enable signal having the second state, the first plurality of series-connected switches and the second plurality of series-connected switches each including at least one switch configured to be open and non-conducting responsive to the sense enable signal having either one of the first state and the second state, and a latch circuit configured to latch and maintain the state of the fuse at an output of the latch circuit.

In one embodiment, the latch circuit is configured as a set-reset latch. In some embodiments, the first plurality of series-connected switches is connected in series with the fuse. In at least one embodiment, the latch circuit includes a first logic gate and a second logic gate. In one embodiment, the first logic gate includes a first input configured to be connected to one or more switches of the first plurality of series-connected switches, and the second logic gate includes a first input configured to be connected to one or more switches of the second plurality of series-connected switches.

In some embodiments, the first plurality of series-connected switches and the second plurality of series-connected switches each includes at least one first switch that is open and non-conducting when the sense enable signal is in the first state and at least one second switch, other than the at least one first switch, that is open and non-conducting when the sense enable signal is in the second state. In at least one embodiment, the at least one first switch of the first plurality of series-connected switches and the second plurality of series-connected switches is at least partially open and conducting during the transition of the sense enable signal.

According to one aspect, a method of sensing a state of a fuse having one of a blown state and an unblown state is provided, the method including acts of receiving a sense signal, the sense signal having a first state and a second state, sensing the state of the fuse responsive to a transition of the sense signal from the first state to the second state, providing a first signal and a second signal indicative of the sensed state of the fuse to a latch circuit responsive to the sense signal having the second state, and maintaining the sensed state of the fuse at an output of the latch circuit.

In some embodiments, maintaining the sensed state of the fuse at the output of the latch circuit consumes negligible power in response to the sense signal being in either one of the first state and the second state.

Still other aspects, examples, and advantages of these exemplary aspects and examples are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, each identical or nearly-identical component that is illustrated in various figures is represented by a like numeral. For purposes of clarity, not every component may be labeled in every figure. In the figures.

DETAILED DESCRIPTION

Aspects of the present disclosure are directed to fuse sensing circuits. These fuse sensing circuits may provide, for example, reduced cost, current consumption, etc. in reading the state of a fuse compared to existing approaches. These benefits may be achieved using a dynamic fuse sensing and latch circuit to sense the state of the fuse and hold the sensed value while consuming negligible current.

It is to be appreciated that examples of the methods and apparatus discussed herein are not limited in application to the details of construction and the arrangement of components set forth in the following description or illustrated in the accompanying drawings. The methods and apparatus are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
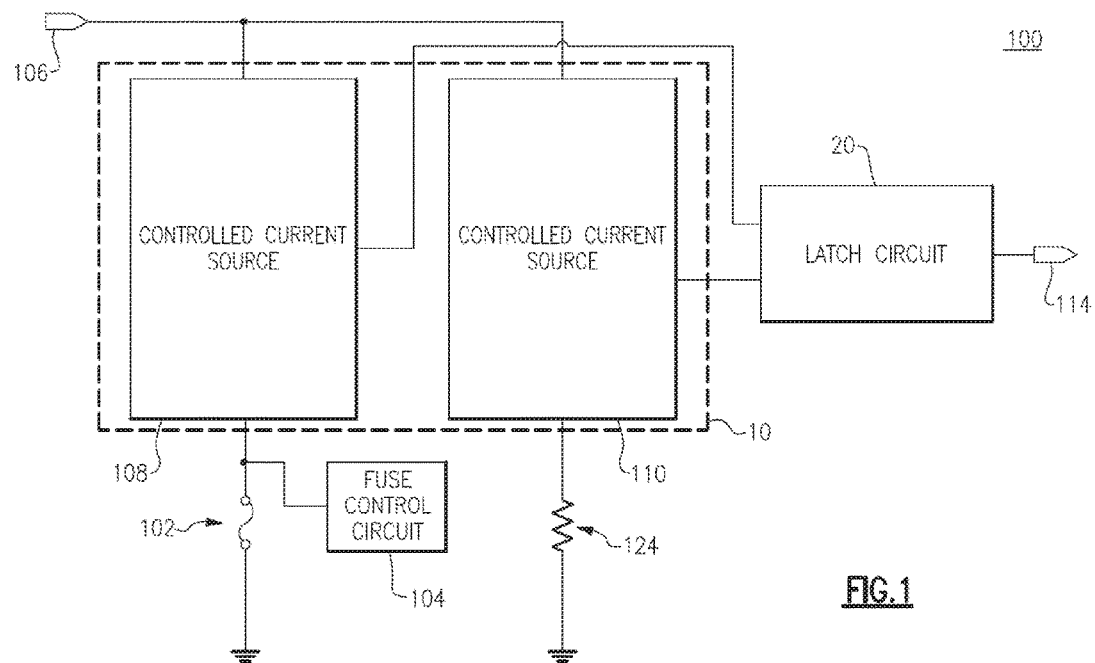
FIG. 1 is a functional block diagram of a dynamic fuse sensing and latch circuit.

FIG. 1 illustrates a functional block diagram of a dynamic fuse sensing and latch circuit 100 configured to dynamically sense and latch a fuse state. The dynamic fuse sensing and latch circuit 100 generally includes a fuse sensing circuit 10, a latch circuit 20, a fuse 102, a fuse control circuit 104, a sense enable input 106, an output 114 and a resistor 124. The fuse sensing circuit 10 includes a first controlled current source 108 and a second controlled current source 110.

The fuse 102 is configured to receive a programming signal from the fuse control circuit 104 to program the state of the fuse 102. The fuse 102 is programmed, or "blown," when a voltage applied across the fuse 102 to a reference node (e.g., a ground node) by the fuse control circuit 104 results in a sufficiently large current (e.g., sufficient to modify the physical structure, and thus the resistance, of the fuse 102) through the fuse 102. The fuse 102 may be, for example, a polysilicon fuse that is formed on an integrated circuit substrate that can include a variety of other circuits, such as amplifiers, switches, processors, etc. The fuse control circuit 104 includes a fuse programming circuit capable of providing a programming voltage sufficient to program the fuse 102, and fuse control logic to control (e.g., enable or disable) the provision of the programming voltage. In alternate examples, the fuse programming circuit and the fuse control logic may supplant the fuse control circuit 104 as distinct elements.

The first controlled current source 108 is configured to receive a sense enable signal from the sense enable input 106, provide a sense current to the fuse 102 to sense the state of the fuse 102, and provide a first output signal representative of the state of the fuse 102 to the latch circuit 20. The second controlled current source 110 is configured to receive the sense enable signal from the sense enable input 106, provide a sense current to the resistor 124 in response thereto, and provide a second output signal representative of the state of the fuse 102 to the latch circuit 20. The latch circuit 20 is configured to receive the first output signal from the first controlled current source 108 and the second output signal from the second controlled current source 110, latch a latch output signal to a value representative of the state of the fuse 102, and provide the latch output signal to the output 114.

Figure 2:
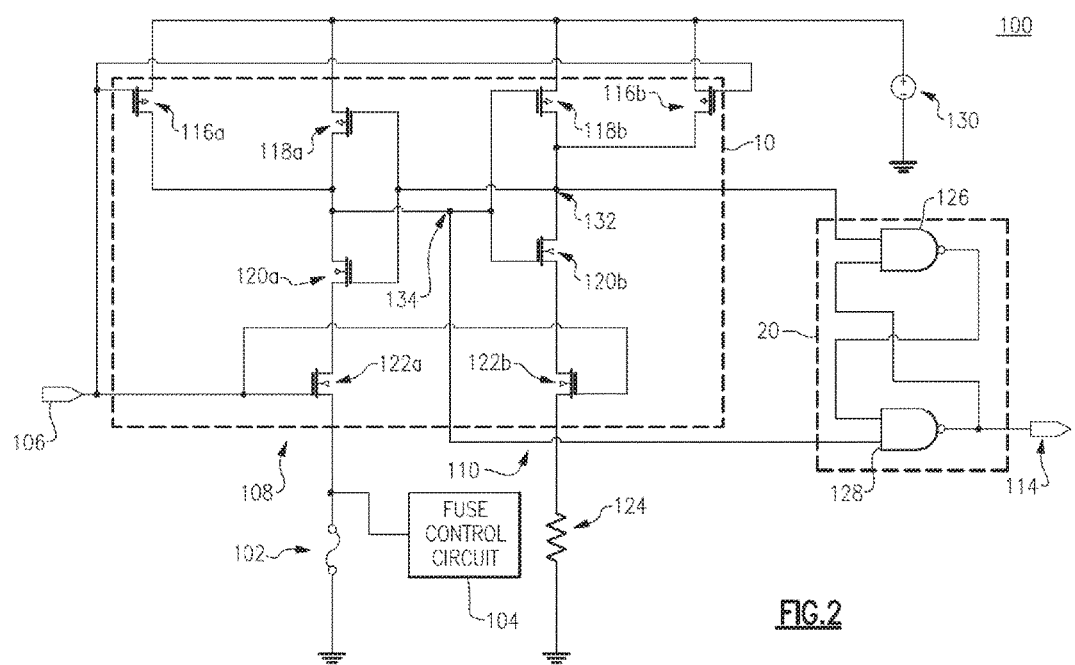
FIG. 2 is a circuit diagram of an example dynamic fuse sensing and latch circuit.

FIG. 2 illustrates a more detailed schematic of the dynamic fuse sensing and latch circuit 100 constructed to sense a state (e.g., blown or unblown) of a fuse. It is to be appreciated that alternate implementations of the dynamic fuse sensing and latch circuit 100 are possible, as discussed below with respect to FIGS. 3-5.

In the embodiment illustrated in FIG. 2, the fuse sensing circuit 10 includes the first controlled current source 108 and the second controlled current source 110. The first controlled current source 108 includes a P-type Metal Oxide Semiconductor Field Effect Transistor (MOSFET) 116a, a P-type MOSFET 118a, an N-type MOSFET 120a, and an N-type MOSFET 122a. The second controlled current source 110 is formed similarly and includes a P-type MOSFET 116b, a P-type MOSFET 118b, an N-type MOSFET 120b, and an N-type MOSFET 122b. The latch circuit 20 includes a first NAND gate 126 and a second NAND gate 128. The first and second NAND gates 126 and 128 are conventional NAND gates known to those of ordinary skill in the art, exhibiting output properties consistent with the truth table illustrated by TABLE 1.

TABLE 1

| Input 1 | Input 2 | Output |
| --- | --- | --- |
| LOW | LOW | HIGH |
| LOW | HIGH | HIGH |
| HIGH | LOW | HIGH |
| HIGH | HIGH | LOW |

The MOSFET 116a includes a source configured to be connected to a voltage source 130, a gate connected to the sense enable input 106, and a drain connected to a drain of the MOSFET 118a, a drain of the MOSFET 120a, a gate of the MOSFET 118b, a gate of the MOSFET 120b, and a first input of the second NAND gate 128. The MOSFET 118a includes a source configured to be connected to the voltage source 130, a gate connected to a gate of the MOSFET 120a, a first input of the first NAND gate 126, a drain of the MOSFET 116b, a drain of the MOSFET 118b, and a drain of the MOSFET 120b, and a drain connected to the drain of the MOSFET 120a, the drain of the MOSFET 116a, the first input of the second NAND gate 128, the gate of the MOSFET 118b, and the gate of the MOSFET 120b.

The drain of the MOSFET 120a is connected to the drain of the MOSFET 116a, the drain of the MOSFET 118a, the first input of the second NAND gate 128, the gate of the MOSFET 118b, and the gate of the MOSFET 120b. The gate of the MOSFET 120a is connected to the gate of the MOSFET 118a, the first input of the first NAND gate 126, the drain of the MOSFET 116b, the drain of the MOSFET 118b, and the drain of the MOSFET 120b, and the source of the MOSFET 120a is connected to a drain of the MOSFET 122a. The drain of the MOSFET 122a is connected to the source of the MOSFET 120a, the gate is connected to the sense enable input 106, and the source is connected to a first contact of the fuse 102. A second contact of the fuse 102 is configured to be connected to a reference potential node (e.g., a ground node), and the fuse 102 is further configured to be operatively coupled to the fuse control circuit 104.

The MOSFET 116b includes a source configured to be connected to the voltage source 130, a gate connected to the sense enable input 106, and a drain connected to the drain of the MOSFET 118b, the drain of the MOSFET 120b, the gates of the MOSFETs 118a and 120a, and the first input of the first NAND gate 126. MOSFET 118b includes a source configured to be connected to the voltage source 130, a gate connected to the gate of the MOSFET 120b, the drains of the MOSFETs 116a and 118a, the drain of the MOSFET 120a, and the first input of the second NAND gate 128, and a drain connected to the drain of the MOSFET 116b, the drain of the MOSFET 120b, the gates of the MOSFETs 118a and 120a, and the first input of the first NAND gate 126.

The MOSFET 120b includes a drain connected to the drain of the MOSFET 116b, the drain of the MOSFET 118b, the gates of the MOSFETs 118a and 120a, and the first input of the first NAND gate 126, a gate connected to the gate of the MOSFET 118b, the drains of the MOSFETs 116a and 118a, the drain of the MOSFET 120a, and the first input of the second NAND gate 128, and a source connected to a drain of the MOSFET 122b. The MOSFET 122b includes a drain connected to the source of the MOSFET 120b, a gate connected to the sense enable input 106, and a source connected to a first contact of the resistor 124. A second contact of the resistor 124 is configured to be connected to a reference potential node (e.g., a ground node).

As noted above, the first input of the first NAND gate 126 is connected to the drain of the MOSFET 116b, the drain of the MOSFET 118b, the drain of the MOSFET 120b, and the gates of the MOSFETs 118a and 120a. A second input of the first NAND gate 126 is connected to an output of the second NAND gate 128, and an output of the first NAND gate 126 is connected to a second input of the second NAND gate 128. The first input of the second NAND gate 128 is connected to the drain of the MOSFET 116a, the drain of the MOSFET 118a, the drain of the MOSFET 120a, and the gates of the MOSFETs 118b and 120b. A second input of the second NAND gate 128 is connected to the output of the first NAND gate 126, and the output of the second NAND gate 128 is connected to the second input of the first NAND gate 126 and the output 114.

As discussed above, the fuse control circuit 104 is operable to program the state (e.g., blown or unblown) of the fuse 102 by altering the resistance of the fuse 102. For example, in one embodiment, an unblown fuse has a resistance of roughly 200 Ohms (Ω) or less, while a blown fuse has a resistance of roughly 2,000Ω or more (i.e., roughly a tenfold increase or more).

In accordance with aspects of the present disclosure, the act of blowing the fuse 102 does not physically destroy the fuse 102, as physical destruction of the fuse 102 could impact other devices proximate to the fuse 102. Rather, in a blown state, the fuse 102 remains physically intact, but the structure of the fuse 102 is changed sufficiently to alter a resistance value of the fuse 102 by, in the example illustrated above, a tenfold increase or more. In one embodiment, the resistor 124 has a resistance of roughly 600-700Ω. The resistor 124 may include a single resistor, or multiple resistors connected in series and/or parallel between the source of the MOSFET 122b and the reference potential node.

In the example illustrated above, it is to be appreciated that the resistance of the resistor 124 is larger than the resistance of the fuse 102 in an unblown state, and less than the resistance of the fuse 102 in a blown state. Therefore, if an identical current is provided to the fuse 102 and the resistor 124, the voltage drop across the fuse 102 in a blown state will be greater than the voltage drop across the resistor 124, and the voltage drop across the fuse 102 in an unblown state will be less than the voltage drop across the resistor 124. To achieve the foregoing properties, in at least one embodiment the first controlled current source 108 and the second controlled current source 110 are constructed in a similar fashion. The first controlled current source 108 and the second controlled current source 110 are preferably formed on the same Integrated Circuit (IC) using substantially identical semiconductor processes so that the various MOSFETs' 116-122 operating characteristics are closely matched. As a result, differences in the voltage dropped across the fuse 102 in the blown and unblown states relative to the voltage dropped across the resistor 124 are primarily due to differences in resistance between the fuse 102 and the resistor 124.

The latch circuit 20, which includes the first NAND gate 126 and the second NAND gate 128, is configured to receive voltages indicative of the state of the fuse 102. Those of ordinary skill in the art will recognize that the latch circuit 20 illustrated by FIG. 2 is configured to operate as a set-reset latch. However, it is to be appreciated that the latch circuit 20 illustrated in FIG. 2 is just one example of a set-reset latch; alternate embodiments may be implemented using alternate logic elements, such as NOR gates, to achieve the same output properties as the latch circuit 20 illustrated in FIG. 2. TABLE 2 provides a truth table for a set-reset latch such as that illustrated in FIG. 2.

TABLE 2

| Set | Reset | Output |
| --- | --- | --- |
| LOW | LOW | Undefined |
| LOW | HIGH | LOW |
| HIGH | LOW | HIGH |
| HIGH | HIGH | Hold |

In the embodiment illustrated by FIG. 2, the first input of the first NAND gate 126 is connected to a node 132 that may be considered the set input of the latch circuit 20, the first input of the second NAND gate 128 is connected to a node 134 that may be considered the reset input of the latch circuit 20, and the output of the second NAND gate 128 is connected to the output 114. As illustrated by TABLE 2, if the nodes 132 and 134 are simultaneously set to a logic LOW value, the output value of the latch circuit 20 is undefined. If the nodes 132 and 134 are simultaneously set to logic HIGH, the output value at the output 114 maintains, or holds, an immediately-preceding output state (i.e., HIGH or LOW) representative of the state of the fuse 102 while consuming a negligible amount of current.

If the node 132 is set to a logic LOW value and the node 134 is set to a logic HIGH value, the latch circuit 20 is operable to output a logic LOW value at the output 114. As will be described in further detail below, a logic LOW value at the output 114 corresponds to the fuse 102 being in a blown state. Conversely, if the node 132 is set to a logic HIGH value and the node 134 is set to a logic LOW value, the latch circuit 20 is operable to output a logic HIGH value at the output 114. As will be described in further detail below, a logic HIGH value at the output 114 corresponds to the fuse 102 being in an unblown state. In alternate embodiments, a logic LOW value at the output 114 corresponds to the fuse 102 being in an unblown state, and a logic HIGH value at the output 114 corresponds to the fuse 102 being in a blown state. Such inverted output properties may be achieved, for example, by an inverter having an input coupled to the output of the NAND gate 128 and an output contact coupled to the output 114 or by altering connections to the node 132 and the node 134.

Operation of the dynamic fuse sensing and latch circuit 100 will now be described in greater detail. As will be understood by one of ordinary skill in the art, P-type MOSFETs, when appropriately biased, are configured to close (i.e., conduct) when a logic LOW is applied to the gates thereof, and open (i.e., not conduct) when a logic HIGH is applied to the gates thereof. Conversely, N-type MOSFETs, when appropriately biased, are configured to open (i.e., not conduct) when a logic LOW is applied to the gates thereof, and close (i.e., conduct) when a logic HIGH is applied to the gates thereof.

When the state of the fuse 102 is not being sensed, the sense enable input 106 is configured to provide a logic LOW value to the gates of the MOSFETs 116a, 116b, 122a, and 122b, thereby opening the MOSFETs 122a and 122b and closing the MOSFETs 116a and 116b. As described above, the source of the MOSFET 116a is connected to the voltage source 130, which is configured to provide a voltage equivalent to a logic HIGH value, and the drain of the MOSFET 116a is connected to the node 134. Similarly, the source of the MOSFET 116b is connected to the voltage source 130, and the drain of the MOSFET 116b is connected to the node 132. Accordingly, when the MOSFETs 116a and 116b are closed (i.e., conducting), the set input (e.g., node 132) and the reset input (e.g., node 134) are at logic HIGH values. As illustrated by TABLE 2, the output of the latch circuit 20, and thus the value at the output 114, will hold an immediately-preceding output value when both the set and reset inputs of the latch circuit 20 are connected to a logic HIGH value. The output 114 therefore maintains either a logic HIGH or a logic LOW value, corresponding to the state of the fuse 102, when the sense enable input 106 is set to a logic LOW value.

As described above, MOSFETs 122a and 122b remain open (i.e., non-conducting) when the sense enable input 106 is set to a logic LOW value. Accordingly, although a logic HIGH value is present at the node 134, negligible current flows through the first controlled current source 108 because the open, series-connected MOSFET 122a prevents any significant flow of current from the node 134 to the reference node. Similarly, although a logic HIGH value is present at the node 132, negligible current flows through the second controlled current source 110 because the open, series-connected MOSFET 122b prevents any significant flow of current from the node 132 to the reference node. Therefore, when the state of the fuse 102 is not being sensed, the dynamic fuse sensing and latch circuit 100 consumes negligible current, but the output 114 still holds an immediately-preceding output value representative of the state of the fuse 102.

When the state of the fuse 102 is to be sensed, the sense enable input 106 is configured to transition from a logic LOW output to a logic HIGH output. This transition switches the MOSFETs 116a and 116b from a closed state to an open state, and the MOSFETs 122a and 122b from an open state to a closed state. In some embodiments, a dead time exists between opening the MOSFETs 116a and 116b and closing the MOSFETs 122a and 122b to prevent a transient current from passing through the MOSFETs 116a and 116b to the MOSFETs 122a and 122b, respectively. For example, in some embodiments, the dead time may last for approximately 2 ns.

After the MOSFETs 116a and 116b have been opened, and the MOSFETs 122a and 122b have been closed, a first conduction path is formed from the voltage source 130 through the MOSFET 118a, the MOSFET 120a, the MOSFET 122a and the fuse 102 to the reference node, and a second conduction path is formed from the voltage source 130 through the MOSFET 118b, the MOSFET 120b, the MOSFET 122b and the resistor 124 to the reference node. MOSFETs 118-122 are selected such that a first transient current flowing through the first conduction path is nearly identical to a second transient current flowing through the second conduction path once the MOSFETs 122a and 122b close. The first transient current may be made identical (or nearly identical) to the second transient current by co-forming MOSFETs 118a and 118b, 120a and 120b, and 122a and 122b using the same semiconductor fabrication process, and forming the MOSFETs on the same semiconductor die. MOSFETs 116a and 116b may be similarly co-formed so that the current sources 108 and 110 operate identically (or nearly identically). As discussed above, the resistor 124 is selected such that the voltage drop across the fuse 102 in a blown state will be greater than the voltage drop across the resistor 124, and the voltage drop across the fuse 102 in an unblown state will be less than the voltage drop across the resistor 124 when the first and second transient currents are equal, or substantially equal.

In a first example, the fuse 102 is in a blown state. Because the first transient current and the second transient current are approximately identical, and the resistance of the fuse 102 is greater than the resistance of the resistor 124, the voltage drop across the fuse 102 will be greater than the voltage drop across the resistor 124. As a result of the greater voltage drop across the fuse 102, the node 134 will be driven to a logic HIGH value, and the node 132 will be driven to a logic LOW value. The logic HIGH state of the node 134, which is connected to the gate of the MOSFET 118b, will drive the MOSFET 118b open. As the MOSFET 118b opens, the second conduction path is broken, and the second transient current is driven to zero. Similarly, the logic LOW state of the node 132, which is connected to the gate of the MOSFET 120a, will open the MOSFET 120a and drive the first transient current to zero. Accordingly, the first and second current sources 108 and 110 only draw current for a brief time after the sense enable input 106 signal changes states.

TABLE 3 illustrates the states of each of the MOSFETs 116-122 after the node 134 has settled at a logic HIGH value and the node 132 has settled at a logic LOW value when the fuse 102 is in a blown state.

TABLE 3

| Switch | State |
| --- | --- |
| MOSFET 116a | Open |
| MOSFET 116b | Open |
| MOSFET 118a | Closed |
| MOSFET 118b | Open |
| MOSFET 120a | Open |
| MOSFET 120b | Closed |
| MOSFET 122a | Closed |
| MOSFET 122b | Closed |

Responsive to receiving a logic LOW value at the node 132 and a logic HIGH value at the node 134, the latch circuit 20 provides a logic LOW value to the output 114. Accordingly, in one embodiment, a logic LOW value at the output 114 corresponds to the fuse 102 being in a blown state. However, as discussed above, the relationship between the state of the fuse 102 and the logic value of the output 114 is a malleable design decision, and that no specific, fixed relationships are meant to be implied by the examples given herein.

In a second example, the fuse 102 is in an unblown state. Because the first transient current and the second transient current are approximately identical, and the resistance of the fuse 102 is less than the resistance of the resistor 124, the voltage drop across the fuse 102 will be less than the voltage drop across the resistor 124. As a result of the lesser voltage drop across the fuse 102, the node 134 will be driven to a logic LOW value, and the node 132 will be driven to a logic HIGH value. The logic LOW state of the node 134, which is connected to the gate of the MOSFET 120b, will drive the MOSFET 120b open. As the MOSFET 120b opens, the second conduction path is broken, and the second transient current is driven to zero. Similarly, the logic HIGH state of the node 132, which is connected to the gate of the MOSFET 118a, will open the MOSFET 118a and drive the first transient current to zero. Accordingly, the first and second current sources 108 and 110 only draw current for a brief time after the sense enable input 106 signal changes states.

TABLE 4 illustrates the states of each of the MOSFETs 116-122 after the node 132 settles at a logic HIGH state and the node 134 settles at a logic LOW state when the fuse 102 is unblown.

TABLE 4

| Switch | State |
| --- | --- |
| MOSFET 116a | Open |
| MOSFET 116b | Open |
| MOSFET 118a | Open |
| MOSFET 118b | Closed |
| MOSFET 120a | Closed |
| MOSFET 120b | Open |
| MOSFET 122a | Closed |
| MOSFET 122b | Closed |

Responsive to receiving a logic HIGH value at the node 132 and a logic LOW value at the node 134, the latch circuit 20 provides a logic HIGH value to the output 114. Accordingly, in the illustrated embodiment, a logic HIGH value at the output 114 corresponds to the fuse 102 being in an unblown state.

It is to be appreciated that, in the above examples, a low-current solution to sensing and holding a binary representation of a fuse state (i.e., blown or unblown) is provided. When the state of the fuse 102 is not being read, the dynamic fuse sensing and latch circuit 100 consumes a negligible amount of current, while still maintaining the most-recently-read state of the fuse 102 at an output 114 of the dynamic fuse sensing and latching circuit 100. The dynamic fuse sensing and latch circuit 100 draws a non-negligible amount of current only during a very small window of time immediately after a change in state of a sense enable signal (e.g., from a logic LOW to a logic HIGH value). For example, in one embodiment, this very small window of time may last for approximately 3 ns. Subsequent to sensing the state of the fuse 102, the sense enable input 106 can transition from a logic HIGH value to a logic LOW value to resume holding the state of the fuse 102 while consuming a negligible amount of current.

Figure 3:
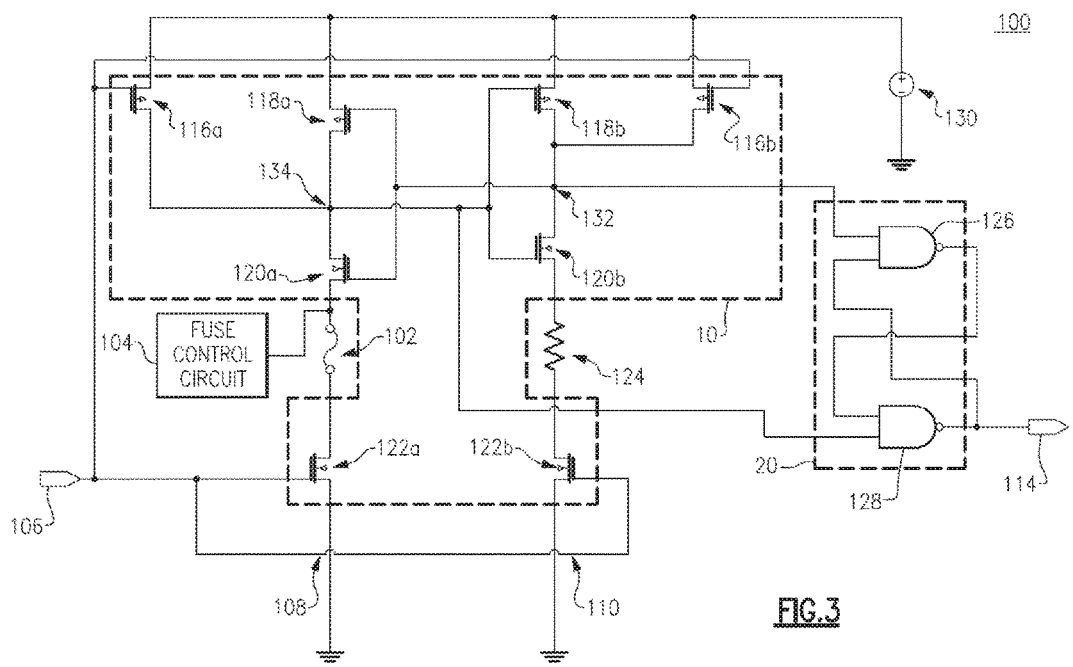
FIG. 3 is a circuit diagram of another example dynamic fuse sensing and latch circuit.
Figure 4:
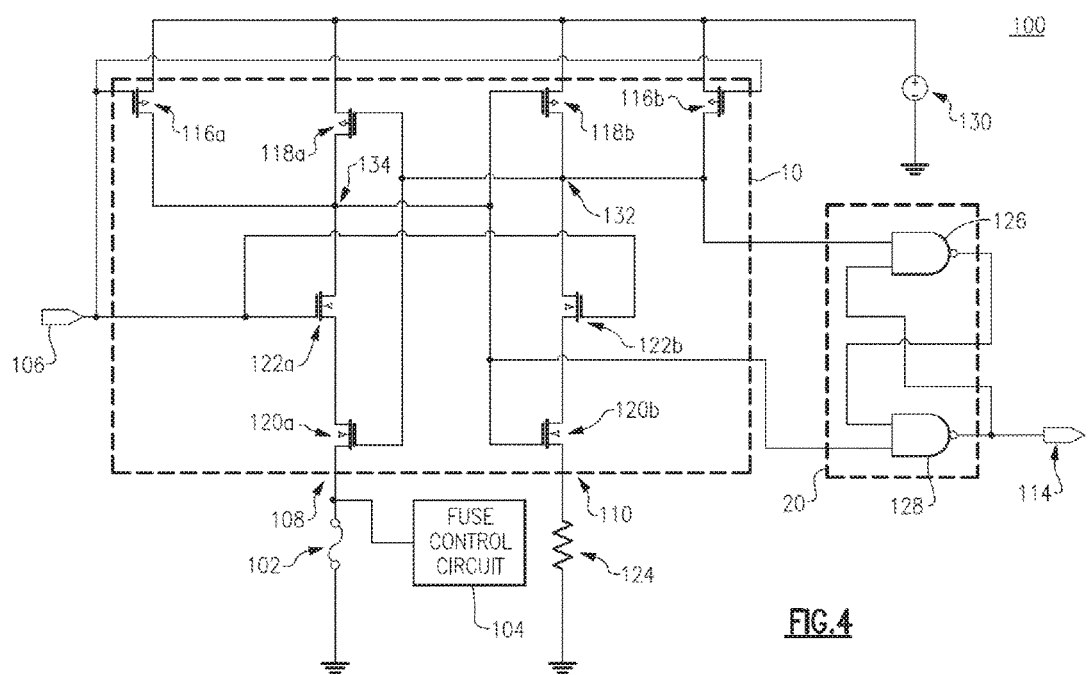
FIG. 4 is a circuit diagram of another example dynamic fuse sensing and latch circuit.
Figure 5:
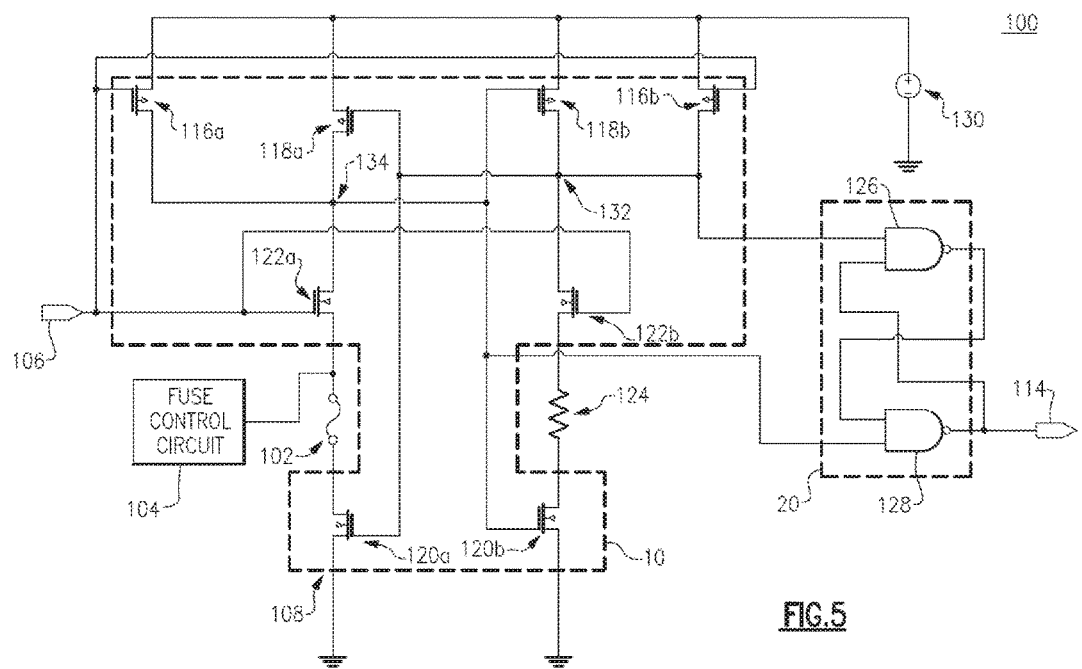
FIG. 5 is a circuit diagram of another example dynamic fuse sensing and latch circuit.

As discussed above, implementations other than that illustrated by FIG. 2 are within the scope of the present disclosure while still achieving a similar result. For example, FIGS. 3-5 illustrate alternate embodiments of the dynamic fuse sensing and latch circuit 100 described above with respect to FIG. 2. In each of FIGS. 3-5, the value at the output 114 will be identical to that of FIG. 2 for a given fuse state, while still consuming a substantially identical (and substantially negligible) amount of current in operation.

FIG. 3 illustrates the dynamic fuse sensing and latch circuit 100 arranged according to another embodiment. The dynamic fuse sensing and latch circuit 100 of FIG. 3 is similar to that of FIG. 2, except that the positions of the fuse 102 and the resistor 124 are switched with the positions of the MOSFETs 120a and 120b, respectively. For example, the first contact of the fuse 102 is connected to the source of the MOSFET 120a and the second contact of the fuse 102 is connected to the drain of the MOSFET 122a. The fuse 102 is further coupled to a fuse control circuit 104 as in the previous example. The drain of the MOSFET 122a is connected to the second contact of the fuse 102, the gate of the MOSFET 122a is connected to the sense enable input 106, and the source of the MOSFET 122a is connected to the reference node.

The first contact of the resistor 124 is connected to the source of the MOSFET 120b and the second contact of the resistor 124 is connected to the drain of the MOSFET 122b. The drain of the MOSFET 122b is connected to the second contact of the resistor 124, the gate of the MOSFET 122b is connected to the sense enable input 106, and the source of the MOSFET 122b is connected to the reference node. All other connections are identical to those described above with respect to FIG. 2.

FIG. 4 illustrates the dynamic fuse sensing and latch circuit 100 arranged according to a third embodiment. The dynamic fuse sensing and latch circuit 100 of FIG. 4 is similar to that of FIG. 2, except that in FIG. 4, the positions of the MOSFETs 120a and 120b are switched with the positions of the MOSFETs 122a and 122b, respectively, relative to FIG. 2. In the first controlled current source 108, the drain of the MOSFET 122a is connected to the drain of the MOSFET 116a, the drain of the MOSFET 118a, the gates of the MOSFETs 118b and 120b, and the first input of the second NAND gate 128. The gate of the MOSFET 122a is connected to the sense enable input 106, and the source of the MOSFET 122a is connected to the drain of the MOSFET 120a. The gate of the MOSFET 120a is connected to the gate of the MOSFET 118a, the drains of the MOSFETs 116b and 118b, the drain of the MOSFET 122b, and the first input of the first NAND gate 126, and the source of the MOSFET 120a is connected to the first contact of the fuse 102. The second contact of the fuse 102 is connected to the reference node, and the fuse 102 is further coupled to the fuse control circuit 104.

In the second controlled current source 110, the drain of the MOSFET 122b is connected to the gates of the MOSFETs 118a and 120a, the drains of the MOSFETs 118b and 116b, and the first input of the first NAND gate 126. The gate of the MOSFET 122b is connected to the sense enable input 106, and the source of the MOSFET 122b is connected to the drain of the MOSFET 120b. The gate of the MOSFET 120b is connected to the drains of the MOSFETs 116a and 118a, the drain of the MOSFET 122a, the gate of the MOSFET 118b and the first input of the second NAND gate 128, and the source of the MOSFET 120b is connected to the first contact of the resistor 124. The second contact of the resistor 124 is connected to the reference node. All other connections are identical to those disclosed above with respect to FIG. 2.

FIG. 5 illustrates the dynamic fuse sensing and latch circuit 100 arranged according to a fourth embodiment. The dynamic fuse sensing and latch circuit 100 of FIG. 5 is similar to that of FIG. 3, except that in FIG. 5, the positions of the MOSFETs 120a and 120b are switched with the positions of the MOSFETs 122a and 122b, respectively. In the first controlled current source 108, the drain of the MOSFET 122a is connected to the drain of the MOSFET 116a, the drain of the MOSFET 118a, the gate of the MOSFET 118b, the gate of the MOSFET 120b and the first input of the second NAND gate 128. The gate of the MOSFET 122a is connected to the sense enable input 106, and the source of the MOSFET 122a is connected to the first contact of the fuse 102. The second contact of the fuse 102 is connected to the drain of the MOSFET 120a, and the fuse 102 is further coupled to the fuse control circuit 104. The drain of the MOSFET 120a is connected to the second contact of the fuse 102, the gate of the MOSFET 120a is connected to the gate of the MOSFET 118a, the drains of the MOSFETs 118b and 116b, the drain of the MOSFET 122b, and the first input of the first NAND gate 126, and the source of the MOSFET 120a is connected to the reference node.

In the second controlled current source 110, the drain of the MOSFET 122b is connected to the gates of the MOSFETs 118a and 120a, the drains of the MOSFETs 118b and 116b and the first input of the first NAND gate 126. The gate of the MOSFET 122b is connected to the sense enable input 106, and the source of the MOSFET 122b is connected to the first contact of the resistor 124. The second contact of the resistor 124 is connected to the drain of the MOSFET 120b. The gate of the MOSFET 120b is connected to the drains of the MOSFETs 116a and 118a, the drain of the MOSFET 122a, the gate of the MOSFET 118b, and the first input of the second NAND gate 128, and the source of the MOSFET 120b is connected to the reference node. All other connections are identical to those described above with respect to FIG. 2.

In the foregoing examples illustrated by FIGS. 3-5, corresponding "pairs" of elements (e.g., MOSFET 120a and 120b) have been shifted together relative to FIG. 2. However, it is to be understood that it is within the scope of the present disclosure that only one component of a pair be moved while the other is not. For example, in one embodiment, the MOSFET 122a can be configured to have the connections shown in FIG. 2, while the MOSFET 122b can be configured to have the connections shown in FIG. 3.

Having described above several aspects of at least one example, it is to be appreciated that various alterations, modifications, and improvements will readily occur to those skilled in the art. Such alterations, modifications and improvements are intended to be part of this disclosure and are intended to be within the scope of the invention. For example, although the switching elements disclosed herein have been depicted as MOSFETs, it is to be understood that other switching elements can be used including, for example, relays, Junction Field Effect Transistors (JFETs), Bipolar Junction Transistors (BJTs), and so forth.

Accordingly, the foregoing description and drawings are by way of example only, and the scope of the invention should be determined from proper construction of the appended claims, and their equivalents.

What is claimed is:

1. An integrated circuit to sense a state of a fuse having one of a blown state and an unblown state, the integrated circuit comprising:
   a fuse sensing circuit having an input and a plurality of outputs, the input being configured to receive a sense signal having a first state and a second state, and the plurality of outputs including a first output to connect to a first contact of the fuse, and a second output to provide a state signal indicative of the state of the fuse, the fuse sensing circuit being configured to provide the state signal responsive to a transition in state of the sense signal from the first state to the second state; and
   a latch circuit having an input to receive the state signal and an output to provide an output signal indicative of the state of the fuse, the latch circuit being configured to store and maintain a value of the output signal.

2. The integrated circuit of claim 1 wherein the latch circuit is configured as a set-reset latch.

3. The integrated circuit of claim 1 wherein the plurality of outputs of the fuse sensing circuit further includes a third output to connect to a reference resistance.

4. The integrated circuit of claim 3 wherein the reference resistance includes at least one resistor, the at least one resistor having a resistance greater than a resistance of the fuse in the unblown state and less than the resistance of the fuse in the blown state.

5. The integrated circuit of claim 4 wherein the fuse sensing circuit includes a first controlled current source and a second controlled current source.

6. The integrated circuit of claim 5 wherein a first output of the first controlled current source is coupled to the first contact of the fuse and a first output of the second controlled current source is coupled to the reference resistance.

7. The integrated circuit of claim 5 wherein the first controlled current source is configured to provide the state signal indicative of the state of the fuse and the second controlled current source is configured to generate a second state signal indicative of the state of the fuse.

8. The integrated circuit of claim 5 wherein the first controlled current source includes a first plurality of series-connected switches and the second controlled current source includes a second plurality of series-connected switches.

9. The integrated circuit of claim 8 wherein the first plurality of series-connected switches and the second plurality of series-connected switches each includes at least one first switch that is open and non-conducting responsive to the sense signal being in the first state.

10. The integrated circuit of claim 9 wherein the first plurality of series-connected switches and the second plurality of series-connected switches each includes at least one second switch that is open and non-conducting responsive to the sense signal being in the second state.

11. The integrated circuit of claim 10 wherein the at least one first switch of the first plurality of series-connected switches and the second plurality of series-connected switches is at least partially open and at least partially conducting during the change in state of the sense signal.

12. The integrated circuit of claim 3 wherein the fuse and the reference resistance are formed in the integrated circuit.

13. The integrated circuit of claim 1 wherein the plurality of outputs of the fuse sensing circuit further includes a third output to connect to a reference resistance, the reference resistance having a resistance greater than a resistance of the fuse in the unblown state and less than the resistance of the fuse in the blown state.

14. An integrated circuit to sense a state of a fuse having one of a blown state and an unblown state, the integrated circuit comprising:
   a fuse sensing circuit including a plurality of series-connected switches connected to the fuse, the fuse sensing circuit being configured to receive a sense enable signal having a first state and a second state, and to generate a state signal indicative of the state of the fuse responsive to a transition of the sense enable signal from the first state to the second state, the plurality of series-connected switches including at least one switch configured to be open and non-conducting responsive to the sense enable signal having either one of the first state and the second state; and
   a latch circuit configured to latch and maintain the state of the fuse at an output of the latch circuit.

15. The integrated circuit of claim 14 wherein the latch circuit is configured as a set-reset latch.

16. The integrated circuit of claim 14 wherein the plurality of series-connected switches is connected in series with the fuse.

17. The integrated circuit of claim 14 wherein the plurality of series-connected switches includes at least one first switch that is open and non-conducting when the sense enable signal is in the first state and at least one second switch, other than the at least one first switch, that is open and non-conducting when the sense enable signal is in the second state.

18. The integrated circuit of claim 17 wherein the at least one first switch of the plurality of series-connected switches is at least partially open and conducting during the transition of the sense enable signal.

19. A method of sensing a state of a fuse having one of a blown state and an unblown state, the method comprising:
   receiving a sense signal, the sense signal having a first state and a second state;
   sensing the state of the fuse responsive to a transition of the sense signal from the first state to the second state;
   maintaining the sensed state of the fuse at an output of a latch circuit; and
   consuming negligible power in response to the sense signal being in either one of the first state and the second state.

20. The method of claim 19 where the sensing is performed by a fuse sensing circuit, the method further comprising consuming negligible power in the fuse sensing circuit while the sense signal is in either one of the first state and the second state.

* * * * *